(12) United States Patent
Zhu et al.

(10) Patent No.: US 10,715,899 B2
(45) Date of Patent: Jul. 14, 2020

(54) WIND NOISE PREVENTION MICROPHONE AND EARPHONE CABLE CONTROL APPARATUS

(71) Applicant: GOERTEK INC., Weifang, Shandong (CN)

(72) Inventors: Liyang Zhu, Weifang (CN); Mingjun Zuo, Weifang (CN); Shiwen Zhang, Weifang (CN); Jiangtao Xu, Weifang (CN)

(73) Assignee: GOERTEK INC., Weifang, Shandong (CN)

( * ) Notice: Subject to any disclaimer, the term of this patent is extended or adjusted under 35 U.S.C. 154(b) by 0 days.

(21) Appl. No.: 16/304,559

(22) PCT Filed: Dec. 19, 2016

(86) PCT No.: PCT/CN2016/110765
§ 371 (c)(1),
(2) Date: Nov. 26, 2018

(87) PCT Pub. No.: WO2017/206487
PCT Pub. Date: Dec. 7, 2017

(65) Prior Publication Data
US 2019/0297406 A1 Sep. 26, 2019

(30) Foreign Application Priority Data

May 30, 2016 (CN) .......................... 2016 1 0375376

(51) Int. Cl.
*H04R 1/00* (2006.01)
*H04R 1/08* (2006.01)
*H04R 1/10* (2006.01)

(52) U.S. Cl.
CPC ............... *H04R 1/083* (2013.01); *H04R 1/08* (2013.01); *H04R 1/10* (2013.01); *H04R 1/1033* (2013.01);
(Continued)

(58) Field of Classification Search
CPC .................................................. H04R 2410/07
See application file for complete search history.

(56) References Cited

U.S. PATENT DOCUMENTS

| 2007/0003090 A1 | 1/2007 | Anderson | |
| 2014/0193024 A1* | 7/2014 | Raff | H04R 1/02 381/394 |

FOREIGN PATENT DOCUMENTS

| CN | 102404656 A | 4/2012 |
| CN | 202617317 U | 12/2012 |

(Continued)

*Primary Examiner* — Matthew A Eason
(74) *Attorney, Agent, or Firm* — Saliwanchik, Lloyd & Eisenschenk

(57) ABSTRACT

The present invention discloses a wind noise prevention microphone and an earphone cable control apparatus. The microphone comprises: a microphone chamber enclosed by a bottom and a first side wall; a microphone unit arranged inside the microphone chamber and of which a sound pick-up hole of the microphone unit is arranged opposite to the bottom, a set gap being arranged between the sound pick-up hole and the bottom; and a sound channel in communication with the sound pick-up hole and an outer space, and led out of the first side wall. The sound channel of the microphone is arranged on a side of the sound pick-up hole of the microphone, other than directly opposite to the sound pick-up hole of the microphone, which can effectively reduce wind noise and improve the sound pick-up quality.

9 Claims, 4 Drawing Sheets

(52) U.S. Cl.
 CPC .... H04R 1/1083 (2013.01); *B81B 2201/0257* (2013.01)

(56) References Cited

FOREIGN PATENT DOCUMENTS

| | | |
|---|---|---|
| CN | 202931519 U | 5/2013 |
| CN | 105959837 A | 9/2016 |

* cited by examiner

WIND NOISE PREVENTION MICROPHONE AND EARPHONE CABLE CONTROL APPARATUS

CROSS REFERENCE TO RELATED APPLICATIONS

This application is a National Stage of International Application No. PCT/CN2016/110765, filed on Dec. 19, 2016, which claims priority to Chinese Patent Application No. 201610375376.X, filed on May 30, 2016, both of which are hereby incorporated by reference in their entireties.

FIELD OF THE INVENTION

The present invention relates to the field of acoustic energy conversion, and in particular, to a wind noise prevention microphone and an earphone cable control apparatus using the same.

BACKGROUND OF THE INVENTION

An existing microphone easily produces wind noise in use, especially in outdoor use. The wind noise is produced by an action of a turbulent flow generated in the case where wind is blown into a sound input hole of a voice device and frictions with a sound channel and a sound pick-up hole of the microphone occur. An existing voice device like a microphone of a control box easily produces wind noise, since microphone elements are arranged opposite to a sound input hole of a housing.

SUMMARY OF THE INVENTION

One objective of the present invention is to provide a new technical solution of a wind noise prevention microphone and an earphone cable control apparatus.

According to a first aspect of the present invention, there is provided a wind noise prevention microphone, comprising:
a microphone chamber enclosed by a bottom and a first side wall;
a microphone unit arranged inside the microphone chamber and of which a sound pick-up hole is arranged opposite to the bottom, a set gap being arranged between the sound pick-up hole and the bottom; and
a sound channel in communication with the sound pick-up hole and an outer space, and led out of the first side wall.

In an embodiment, the first side wall is perpendicular to the bottom, and the sound channel is arranged opposite to the gap between the sound pick-up hole and the bottom.

In an embodiment, the sound channel is linear, arc-shaped or wavy-line-shaped.

In an embodiment, the sound channel is provided with spoilers protruding from an inner wall of the sound channel and interleaved with one another.

In an embodiment, the cross section of the sound channel is a circle, a rectangle, a semicircle, a trapezoid or a triangle.

In an embodiment, the sound channel is filled with foam or sponge.

In an embodiment, the microphone unit is an electret microphone or an MEMS microphone.

According to the other aspect of the present invention, there is provided an earphone cable control apparatus, comprising: a housing having an apparatus chamber, an audio processing means and the wind noise prevention microphone according to the first aspect, wherein the wind noise prevention microphone and the audio processing means are arranged in the apparatus chamber, the wind noise prevention microphone is in signal connection with the audio processing means, one end of the sound channel is led out of the first side wall, and the other end of the sound channel is led out of a housing wall of the housing to form a receiving hole.

In an embodiment, the other end of the sound channel is led out of a second side wall of the housing.

In an embodiment, the housing, the bottom, the first side wall as well as the sound channel are integrally formed.

The inventor of the present invention finds that in the prior art, as a sound pick-up hole of a microphone is arranged opposite to a sound channel of a voice device, such a structure easily produces wind noise and thus affects a pick-up effect of a sound. Therefore, the technical task to be accomplished or the technical problem to be resolved in the present invention has never been conceived of or anticipated by a person skilled in the art, and therefore the present invention is a new technical solution.

The sound channel of the wind noise prevention microphone provided in the present invention is arranged on a side of the sound pick-up hole of the microphone, other than directly opposite to the sound pick-up hole of the microphone, which can effectively reduce wind noise and improve the sound pick-up quality.

In addition, arranging foam or sponge in the sound channel can reduce wind noise more effectively.

In addition, the earphone cable control apparatus is provided with the wind noise prevention microphone and has a feature of a good sound effect.

Other features and advantages of the present invention will become apparent from the following detailed description of exemplary embodiments of the present invention with reference to the accompanying drawings.

BRIEF DESCRIPTION OF THE DRAWINGS

The accompanying drawings, which are incorporated in and constitute a part of the description, illustrate embodiments of the present invention and, together with the description thereof, serve to explain the principles of the present invention.

Figure 1:
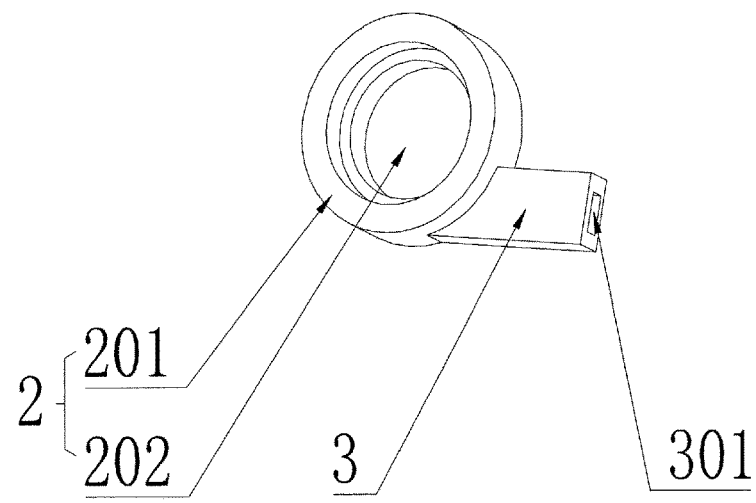
FIG. 1 is a schematic view of the microphone chamber and the sound channel of the embodiment of the present invention.
Figure 2:
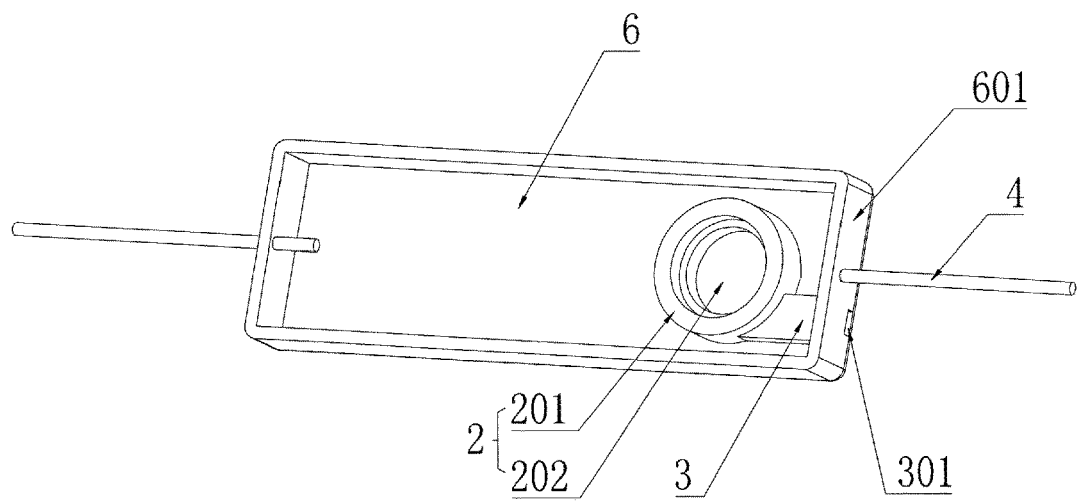
FIG. 2 is a schematic view of a voice device without a microphone unit in the embodiment of the present invention.

in the drawings, the following numerals represent the members as below, 1: microphone unit; 101: sound pick-up hole; 2: microphone chamber; 201: first side wall; 202: bottom; 3: sound channel; 301: receiving hole; 302: spoiler; 4: conductive wire; 5: foam; 6: housing; 601: second side wall; and 7: audio processing means.

DETAILED DESCRIPTION OF THE EMBODIMENTS

Various exemplary embodiments of the present invention will now be described in detail with reference to the accompanying drawings. It should be noted that the relative arrangement, numerical expressions and numerical values of the components and steps set forth in these examples do not limit the scope of the invention unless otherwise specified.

The following description of at least one exemplary embodiment is in fact merely illustrative and is in no way intended as a limitation to the present invention and its application or use.

Techniques, methods, and apparatus known to those of ordinary skill in the relevant art may not be discussed in detail but where appropriate, the techniques, methods, and apparatus should be considered as part of the description.

Among all the examples shown and discussed herein, any specific value should be construed as merely illustrative and not as a limitation. Thus, other examples of exemplary embodiments may have different values.

It should be noted that similar reference numerals and letters denote similar items in the accompanying drawings, and therefore, once an item is defined in a drawing, and there is no need for further discussion in the subsequent accompanying drawings.

In order to at least solve one of the problems, the present invention provides a wind noise prevention microphone. The wind noise prevention microphone can be applied to, but not limited to, voice devices such as a mobile phone, a computer, an intelligent watch, an intelligent control box, an intercom, a stationary telephone and the like. As shown in FIG. 1, the microphone comprises: a microphone chamber 2, a microphone unit 1 and a sound channel 3. The microphone chamber 2 is enclosed by a bottom 202 and a first side wall 201, and is an enclosed chamber. The shape of the microphone chamber 2 will depend on an outline structure of the microphone unit 1. The microphone unit 1 can be, but not limited to, a moving-coil microphone, a moving-iron microphone, an electret microphone (ECM) and a micro-electro-mechanical systems (MEMS) microphone, where the ECM microphone and the MEMS microphone have characteristics of a small volume, flatness, lightness and thinness, and are particularly suitable in an electronic device. In general, the ECM microphone has a circular sheet shape, and the MEMS microphone has a square sheet shape, then the microphone chamber 2 can be adapted to a profile of the microphone unit 1.

Figure 3:
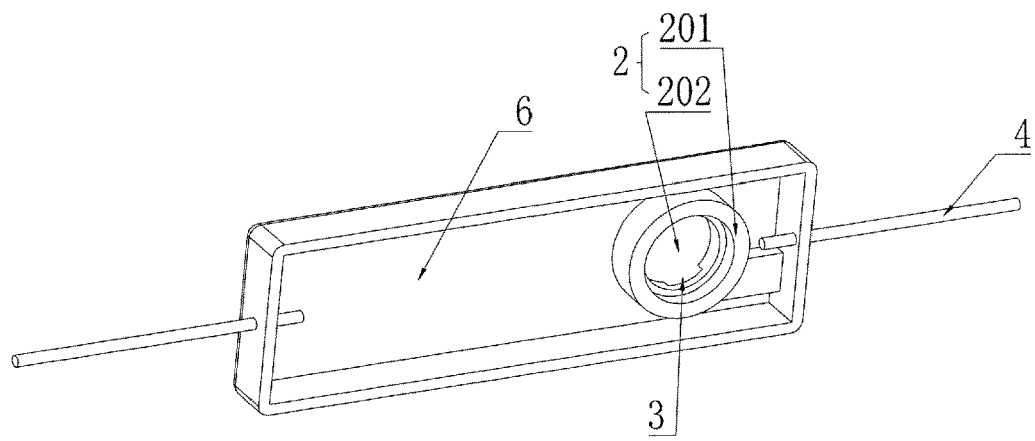
FIG. 3 is a view of another angle of FIG. 2.
Figure 4:
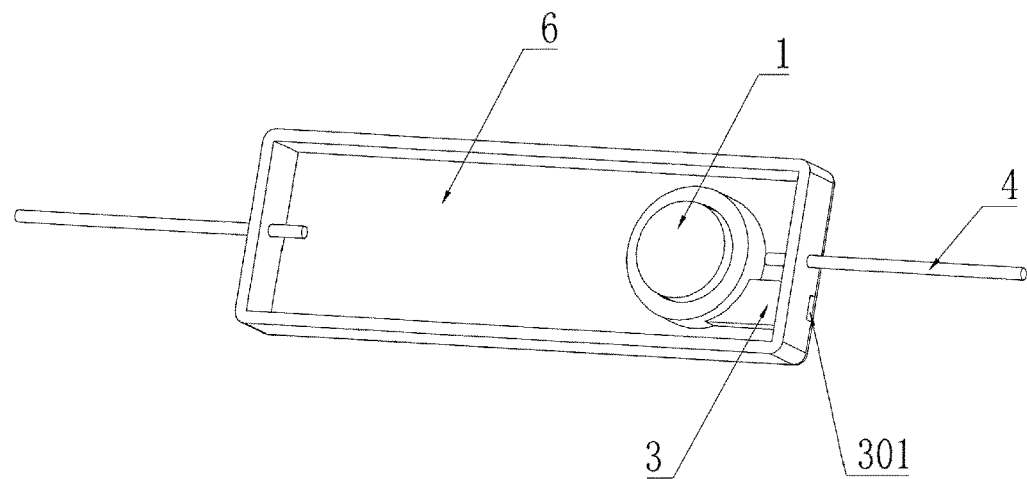
FIG. 4 is a schematic view of a voice device having a wind noise prevention microphone of the embodiment of the present invention.
Figure 5:
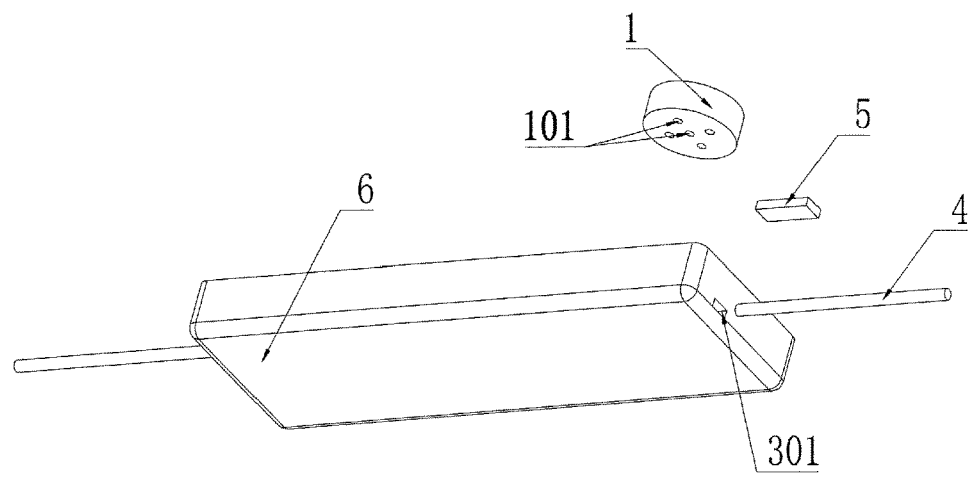
FIG. 5 is an exploded view of the voice device having the wind noise prevention microphone of the embodiment of the present invention.
Figure 6:
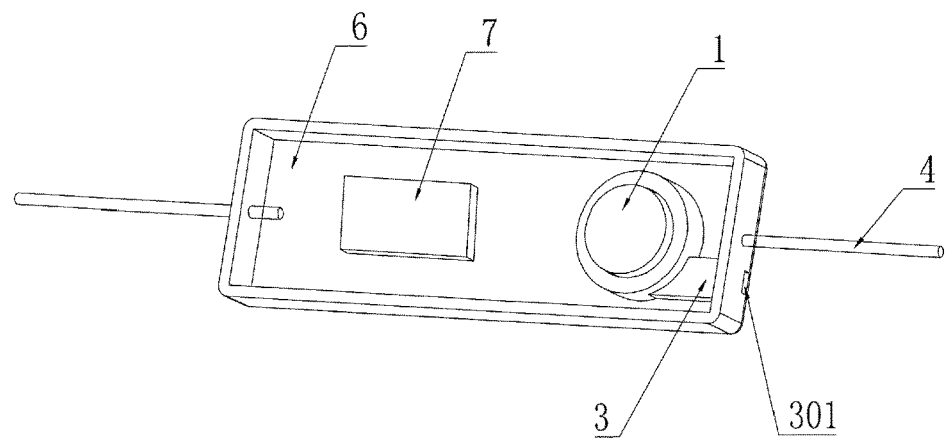
FIG. 6 is a schematic view of an earphone cable control apparatus of the embodiment of the present invention.

As shown in FIGS. 4-6, the sound pick-up hole 101 of the microphone unit 1 is arranged opposite to the bottom 202, a set gap being arranged between the sound pick-up hole 101 and the bottom 202 to provide a space for a sound to enter. The sound channel 3 is configured to communicate the sound pick-up hole 101 with an outer space. In an embodiment of the present invention, the sound channel 3 is arranged to be led out of the first side wall 201. More preferably, as shown in FIG. 3, the first side wall 201 is perpendicular to the bottom 202, and the sound channel 3 is arranged opposite to the gap between the sound pick-up hole 101 and the bottom 202. Thus, the wind incoming from outside blows in parallel with the sound pick-up hole 101, which further reduces wind noise. The sound channel 3 can be fixed on the bottom 202 through the technical means well known in the art, in manners such as bonding with double-sided adhesive tapes, gluing and the like. Certainly, if the first side wall 201 has an enough thickness that is sufficient to enable an entry of sounds along a thickness direction of the side wall, the sound channel 3 may not be provided. The sound channel 3 is directly arranged on the first side wall 201.

The sound channel 3 of the wind noise prevention microphone is arranged on a side of the sound pick-up hole 101 of the microphone. Avoiding wind in an external environment from being directly blown into the sound pick-up hole 101 can effectively reduce wind noise and improve the sound pick-up quality.

In a specific embodiment of the present invention, materials of the bottom 202, the first side wall 201 and the sound channel 3 of the wind noise prevention microphone can be, but are not limited to, plastics, silica gels, rubbers or thermoplastic elastomers (TPE). Preferably, it can be integrally formed in an injection molding process.

Figure 7:
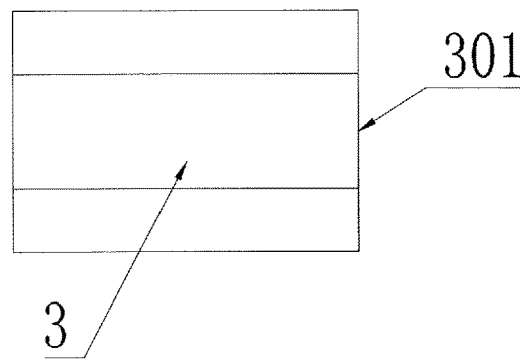
FIG. 7 is a schematic view of the sound channel of the embodiment of the present invention.
Figure 8:
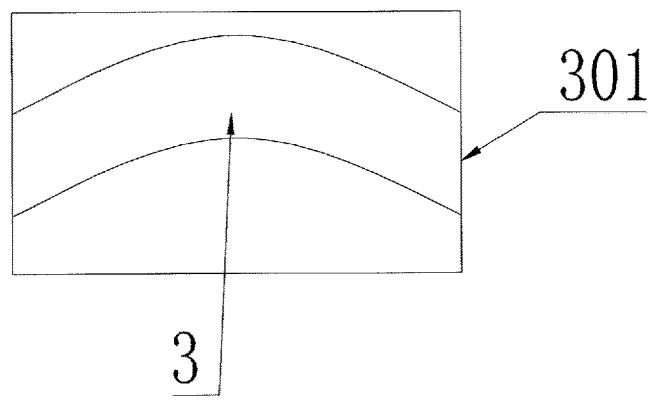
FIG. 8 is a schematic view of another sound channel of the embodiment of the present invention.
Figure 9:
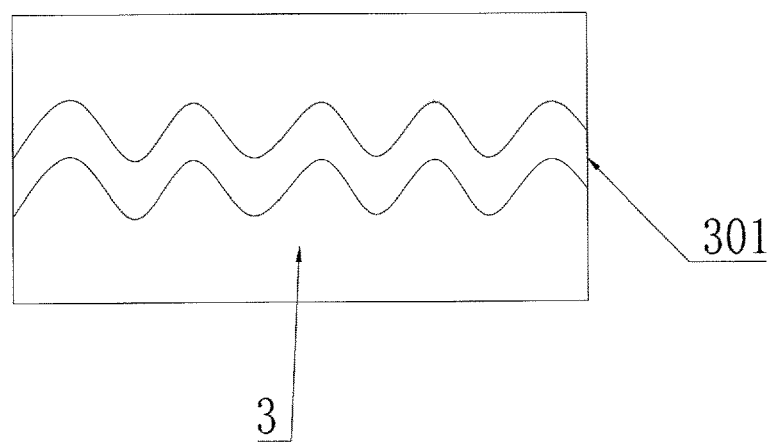
FIG. 9 is a schematic view of a third sound channel of the embodiment of the present invention.
Figure 10:
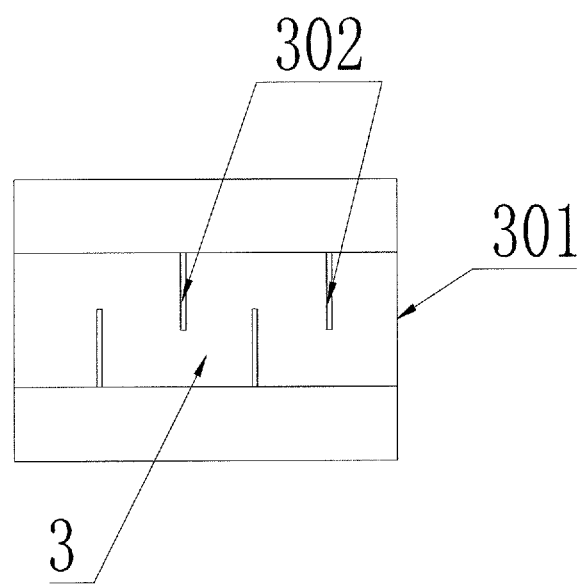
FIG. 10 is a schematic view of a fourth sound channel of the embodiment of the present invention.

It should be noted that a length of the sound channel 3 can be set according to actual needs. The greater the length, the better the wind noise prevention effect. However, the greater the acoustic resistance encountered during sound propagation, the greater the distortion of sounds; on the contrary, the smaller the length, the less distinct the wind noise prevention effect. As shown in FIGS. 7-9, the sound channel 3 can be, but are not limited to, linear, arc-shaped or wavy-line-shaped. A linear sound channel 3 is simple in structure and easy to manufacture, and an arc-shaped or wavy-line-shaped sound channel 3 can increase a wind flowing distance within a limited length, and hence increase the acoustic resistance of the sound channel 3, which can effectively reduce a wind speed after it enters, and achieve a better wind noise prevention effect. In other examples, as shown in FIG. 10, the sound channel 3 is provided with spoilers 302 protruding from an inner wall of the sound channel 3 and interleaved with one another. Arranging the spoilers 302 can not only extend a flow path of wind, but also effectively reduces the wind speed by way of blocking using the spoilers 302. Such a structure can further reduce the wind noise.

A cross section of the sound channel 3 can be selected according to actual needs, and it is not limited to a circle, a rectangle, a semicircle, a trapezoid or a triangle. A cross-sectional area of the sound channel 3 has a great influence on the wind noise prevention effect. The larger the cross-sectional area, then the larger the wind volume incoming from the outer space and the greater the wind noise; on the contrary, the smaller the cross-sectional area, then the smaller the incoming wind volume and the smaller the wind noise, but the greater the distortion of sounds.

In order to further improve the wind noise prevention effect, in a specific embodiment of the present invention, as shown in FIG. 5, the sound channel 3 is filled with foam 5 or sponge. The foam 5 or sponge, which exhibits a porous structure and has a large specific surface area and a large number of fiber structures, can effectively reduce a wind speed of incoming wind and can absorb wind noise. In addition, the foam 5 or sponge can also effectively prevent impurities such as external dust and the like from entering, which reduces the distortion of sounds resulting from the entry of the impurities.

The present invention further provides an earphone cable control apparatus. As shown in FIGS. 2-6, the apparatus comprises: a housing 6 having an apparatus chamber, an audio processing means 7 and the wind noise prevention microphone provided in the present invention. The wind noise prevention microphone and the audio processing means 7 are arranged in the apparatus chamber, and are in an electrical or signal connection by a conductive wire 4 with an external device. A housing wall of the housing 6 can be used as the bottom 202 of the wind noise prevention microphone, and the first side wall 201 is arranged on the housing wall to form a microphone apparatus chamber. The wind noise prevention microphone is in signal connection with the audio processing means 7, thus the signal connection can be realized therebetween by a PCB. One end of the sound channel 3 is led out of the first side wall 201, and the other end of the sound channel 3 is led out of a housing wall of the housing 6 to form a receiving hole 301. The audio processing means is configured to process the audio received by the microphone. In some examples, the audio processing means directly converts the received sound signals to transmissible audio signals, and transmits the audio signals to another audio apparatus, thereby realizing an audio transmission function. In other examples, the audio processing means further comprises a code library and a transmission device. The means can compare the received sound signal with the keywords pre-stored in the code library and output the comparison result to realize a voice control function.

It should be noted that materials of the housing 6, and the bottom 202, the first side wall 201, the sound channel 3 of the wind noise prevention microphone can be, but are not limited to, plastics, silica gels, rubbers or thermoplastic elastomers (TPE). During manufacture, they can be integrally formed in an injection molding process.

The wind noise prevention microphone used in the earphone cable control apparatus has complied with the lightness and thinness development trend of an electronic device. The receiving hole 301 of the wind noise prevention microphone can be arranged on a side of the earphone cable control apparatus as needed. In some examples, as shown in FIG. 6, the other end of the sound channel 3 is led out of the second side wall 601 of the housing 6 to form the receiving hole 301. The arrangement position of the receiving hole 301 may not be limited by the position of the sound pick-up hole 101 of the microphone. The earphone cable control apparatus has characteristics of a low wind noise and a good sound effect.

While certain specific embodiments of the present invention have been illustrated by way of example, it will be understood by those skilled in the art that the foregoing examples are provided for the purpose of illustration and are not intended to limit the scope of the present invention. It will be understood by those skilled in the art that the foregoing embodiments may be modified without departing from the scope and spirit of the invention. The scope of the present invention is subject to the attached claims.

What is claimed is:

1. A wind noise prevention microphone, comprising:
   a microphone chamber enclosed by a bottom and a first side wall;
   a microphone unit arranged inside the microphone chamber and of which a sound pick-up hole is arranged opposite to the bottom, a set gap being arranged between the sound pick-up hole and the bottom; and
   a sound channel in communication with the sound pick-up hole and an outer space, and led out of the first side wall,
   wherein a first spoiler and a second spoiler protrude from an inner wall of the sound channel, the first spoiler and the second spoiler are opposite to and spaced apart from each other in a direction perpendicular to the sound channel, and the first spoiler and the second spoiler are overlapped in a sound channel direction.

2. The wind noise prevention microphone according to claim 1, wherein the first side wall is perpendicular to the bottom, and the sound channel is arranged opposite to the gap between the sound pick-up hole and the bottom.

3. The wind noise prevention microphone according to claim 1, wherein the sound channel is linear, arc-shaped or wavy-line-shaped.

4. The wind noise prevention microphone according to claim 1, wherein the cross section of the sound channel is a circle, a rectangle, a semicircle, a trapezoid or a triangle.

5. The wind noise prevention microphone according to claim 1, wherein the sound channel is filled with foam or sponge.

6. The wind noise prevention microphone according to claim 1, wherein the microphone unit is an electret microphone or an MEMS microphone.

7. An earphone cable control apparatus, comprising: a housing having an apparatus chamber, an audio processing means and the wind noise prevention microphone according to claim 1, wherein the wind noise prevention microphone and the audio processing means are arranged in the apparatus chamber, the wind noise prevention microphone is in signal connection with the audio processing means, one end of the sound channel is led out of the first side wall, and the other end of the sound channel is led out of a housing wall of the housing to form a receiving hole.

8. The earphone cable control apparatus according to claim 7, wherein the other end of the sound channel is led out of a second side wall of the housing.

9. The earphone cable control apparatus according to claim 7, wherein the housing, the bottom, the first side wall as well as the sound channel are integrally formed.

\* \* \* \* \*